(12) United States Patent
Hiroshima

(10) Patent No.: US 8,130,335 B2
(45) Date of Patent: Mar. 6, 2012

(54) ELECTRO-OPTIC SUBSTRATE, ELECTRO-OPTIC DEVICE, METHOD OF DESIGNING THE ELECTRO-OPTIC SUBSTRATE, AND ELECTRONIC DEVICE

(75) Inventor: Yasushi Hiroshima, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 1066 days.

(21) Appl. No.: 12/026,100

(22) Filed: Feb. 5, 2008

(65) Prior Publication Data

US 2008/0191210 A1    Aug. 14, 2008

(30) Foreign Application Priority Data

Feb. 13, 2007  (JP) ................. 2007-031623
Jan. 22, 2008  (JP) ................. 2008-011212

(51) Int. Cl.
*G02F 1/136* (2006.01)
*H01L 27/02* (2006.01)

(52) U.S. Cl. ........ 349/47; 349/44; 257/59; 257/E27.009

(58) Field of Classification Search .................. 349/43, 349/47, 44, 46; 257/59, 72, E27.009
See application file for complete search history.

(56) References Cited

U.S. PATENT DOCUMENTS
7,161,592 B2 * 1/2007 Murade ................. 345/206

FOREIGN PATENT DOCUMENTS
JP      A-10-293320      11/1998

* cited by examiner

*Primary Examiner* — Uyen Chau N Le
*Assistant Examiner* — Michael Mooney
(74) *Attorney, Agent, or Firm* — Oliff & Berridge, PLC

(57) ABSTRACT

Stray light in an oblique direction penetrates a channel part of a thin-film transistor, which sometimes causes light leakage current. This phenomenon becomes more pronounced in the case of using an optical system with high intensity, leading to deterioration in an image quality.
To prevent the light that possibly penetrates an equivalent optical waveguide from reaching the channel part, on the condition that a first insulating layer is set to have a layer-thickness t (nm) and a refraction index n, a relation is to be expressed by the following expression. $t<(0.61\times\lambda)/(n\times\sin\theta)$ A value of $\lambda$ is set to a lower limit 400 (nm) of a visible light wavelength and a value $L_c$ (nm) is set to a distance between an end of a light-shielding layer and an end of a channel region. With those values, an expression of $nt^2/244$ (nm)$<L_c$ (nm) is set up. By controlling a layer-thickness of the first insulating layer and a distance between the end of the light-shielding layer and the end of the channel region in a manner to fulfill the above expression, the deterioration in the image quality due to the stray light in the oblique direction can be minimized.

13 Claims, 8 Drawing Sheets

ELECTRO-OPTIC SUBSTRATE, ELECTRO-OPTIC DEVICE, METHOD OF DESIGNING THE ELECTRO-OPTIC SUBSTRATE, AND ELECTRONIC DEVICE

TECHNICAL FIELD

The present invention relates to an electro-optic substrate, an electro-optic device, a method of designing the electro-optic substrate, and an electronic device.

BACKGROUND ART

In a liquid crystal device defined as an electro-optic device used in an electronic device such as a projector, for example, light is incident on one surface of the liquid crystal device. Light characteristics of the incident light are spatially modulated by driving a thin-film transistor that electrically controls optical transparency of the liquid crystal device and then applying a potential to a liquid crystal region. The light is then made to emerge from the other surface of the liquid crystal device such that patterns of images or letters are formed. Herein, to minimize a light leakage current caused by the incidence of the light on a channel region of the thin-film transistor, such a structure is employed, that a light-shielding layer is formed between the thin-film transistor and a light source of the light.

Other than the above case, the light having been incident on one surface sometimes returns to a channel part of the thin-film transistor due to, for example, reflection on the other surface of an electro-optic substrate. To prevent the light described above from being incident on the thin-film transistor, the employed structure is that another light-shielding layer is formed between the thin-film transistor and a second surface of the electro-optic substrate. This light-shielding layer prevents the light from being directly incident on a semiconductor layer of the thin-film transistor.

In recent years, SOI technologies have been considered in accordance with reduction of writing time per pixel, request for high contrast, and soon, that results from increase in pixel number of a display device. With the use of the SOI technology, a thin-film transistor of a single crystal can be used instead of a thin-film crystal of a polycrystal, thereby achieving high-speed switching. Patent Document 1, for example, describes a manufacturing method by which a light-shielding layer at a closer side to a substrate is obtained using the SOI technologies. By this manufacturing method, the light-shielding layer is formed on a surface of an optically-transparent substrate, thereby being covered with a silicon oxide film, which is then flattened by polishing. A single-crystal silicon film is then affixed onto the flattened surface. Thereafter, the single-crystal silicon film is eliminated while a thin-layer of a single-crystal silicon is left. In this manner, a substrate having an SOI is formed.

[Patent Document 1]
    Japanese Unexamined Patent Application Publication No. 10-293320

DISCLOSURE OF THE INVENTION

Problems to be Resolved by the Invention

Display devices including the liquid crystal device contain therein diffused reflection from many of optical components or constructional elements, in which the electro-optic substrate formed with the thin-film transistor receives, other than the light that is vertically incident, components of the light that is obliquely incident on as stray light. Especially in recent years, the intensity of a light source is increased to achieve brighter images, which accelerates the tendency toward increase in the intensity of stray light penetrating the thin-film transistor. To prevent deterioration in the image quality associated with occurrence of the light leakage current, such an electro-optic substrate is necessary, that exhibits sufficient light-shielding performance toward the light obliquely incident.

In the case of using the single-crystal silicon layer with an excellent crystallinity as a semiconductor forming the thin-film transistor, carriers such as electrons or holes occurring from excitation caused by the incidence of light hardly recombine. Therefore, compared with the case using a polycrystal, the higher light-shielding is needed to minimize the light leakage current passing between a source and a drain of the semiconductor device, due to the incidence of the light. According to research by an inventor of the present invention, compared with the case using the polycrystal silicon layer with more crystal faults, there is a problem in the case of using the single-crystal silicon, that the light leakage current is increased by about ten times to thereby cause deterioration in the displayed image quality.

Therefore, this invention is intended to provide an electro-optic substrate having a thin-film transistor that minimizes a light leakage current, an electro-optic device, a method of designing the electro-optic substrate, and an electronic device.

Means for Solving the Problems

In this application, an "upward direction" is defined as a direction moving apart from a substance composing the substrate. An "opening" is defined as such a portion that contributes to display, within a region overlapping with a pixel electrode.

To solve the above-described problems, an electro-optic substrate according to the present invention includes: a transparent substrate; a first light-shielding layer disposed on at least one part of a region surrounding an opening in a plane view, at a side of a first surface of the transparent substrate; a first insulating layer having a refraction index n and a layer-thickness t (nm), as an insulating layer sandwiched between the first light-shielding layer and the transparent substrate; a thin-film transistor disposed between the first insulating layer and the transparent substrate, the thin-film transistor having a channel region positioned inside the first light-shielding layer in a plane view; a semiconductor layer with a distance $L_c$ (nm) between an end of the first light-shielding layer and an end of the channel region set to fulfill an expression of $nt^2/244$ (nm)<$L_c$ (nm) (a relational expression 1); a gate insulating layer covering at least the channel region; a gate electrode disposed to a region opposite to the channel region with the gate insulating layer intervened therebetween; a second light-shielding layer disposed between the semiconductor layer and the transparent substrate; and a second insulating layer disposed between the semiconductor layer and the second light-shielding layer.

With the above structure, the condition for preventing the penetration of the light is expressed by the below expression based on the Rayleigh's diffraction condition, where a wavelength of the light is set to λ (nm), a total layer-thickness of the first insulating layer (referred to as a light-guiding layer) with a multi-layer structure is set to t (nm), a refraction index of the first insulating layer is set to n, and an angle of incidence of the stray light is set to θ.

$t<(0.61×λ)/(n×\sin θ)$ (the relational expression 5). In this case, the shortest wavelength of a visible light is set to 400 nm. In the case of expression of sin θ (opposite side/oblique side) using a distance $L_c$ (nm) between the end of the first light-shielding layer and the end of the channel region, a value of $L_c$ corresponds to the oblique side while a value of t corresponds to the thickness of the light-guiding layer, $\sin \theta$ is equal to $t/L_c$. When this correspondence relation is assigned to the relational expression 5, the expression of $nt^2/244$ (nm)$<L_c$ (nm) (the relational expression 1) is set up. The channel region is disposed in a manner to fulfill the relational expression 1 so that the end of the channel region can be disposed at a position exceeding a limitation of light-penetration. Thus, occurrence of the light leakage current can be minimized, which results from the stray light to the channel region. Since the occurrence of the light leakage current can be minimized, the noise generated due to the stray light can be minimized, thereby being able to provide the electro-optic substrate with high image quality.

In the electro-optic substrate according to this invention, the thin-film transistor contains an LDD region and the semiconductor layer with the distance $L_c$ between the end of the first light-shielding layer and the end of the channel region set to fulfill the relational expression 1, and with a distance $L_1$ (nm) between the end of the first light-shielding layer and an end of the LDD region set to fulfill an expression of $nt^2/244$ (nm)$<L_1$ (nm) (a relational expression 2).

With the above structure, the channel region and the LDD region are disposed at a position exceeding a penetration depth of the light. By disposing the channel region and the LDD region in a manner to fulfill expressions of $nt^2/244$ (nm)$<L_c$ (nm) (a relational expression 1) and $nt^2/244$ (nm)$<L_1$ (nm) (a relational expression 2), the penetration of the stray light into these regions can be minimized. Thus, the occurrence of the light leakage current at both of the channel region and the LDD region can be minimized. Since the occurrence of the light leakage current can be minimized at the LDD region as well, the generation of the noise due to the stray light can be minimized too, so that the electro-optic substrate with higher image quality can be provided.

To solve the above problems, an electro-optic substrate according to this invention includes: a transparent substrate; a first light-shielding layer disposed on at least one part of a region surrounding an opening in a plane view, at a side of a first surface of the transparent substrate; a first insulating layer having a refraction index n and a layer-thickness t (nm), as an insulating layer sandwiched between the first light-shielding layer and the transparent substrate; a thin-film transistor disposed between the first insulating layer and the transparent substrate, the thin-film transistor having a channel region positioned inside the first light-shielding layer in a plane view; a semiconductor layer set to fulfill an expression of $nt^2/0.61\lambda$ (nm)$<(t^2+X_c^2)^{0.5}$ (nm) (a relational expression 3), on the condition that $X_c$ (nm) is set to a distance between an end of the first light-shielding layer and a normal from an end of the channel region to the first light-shielding layer and $\lambda$ (nm) is set to a shortest wavelength of light that is possibly incident on the transparent substrate; a gate insulating layer covering at least the channel region; a gate electrode disposed to a region opposite to the channel region with the gate insulating layer intervened therebetween; a second light-shielding layer disposed between the semiconductor layer and the transparent substrate; and a second insulating layer disposed between the semiconductor layer and the second light-shielding layer.

With the above structure, the condition for preventing the penetration of the light is expressed by the below expression, where a wavelength of the light is set to $\lambda$ (nm), a total layer-thickness of the first insulating layer (referred to as a light-guiding layer) with a multi-layer structure is set to t (nm), an average refraction index of the first insulating layer is set to n, and an angle of incidence of the stray light is set to $\theta$.

$t<(0.61\times\lambda)/(n\times\sin\theta)$ (a relational expression 5) In this case, in the case of expression of $\sin\theta$ (opposite side/oblique side) using a distance $X_c$ (nm) between the end of the first light-shielding layer and a normal from the end of the channel region to the first light-shielding layer, $(t^2+X_c^2)^{0.5}$ (nm) corresponds to a oblique side while a layer-thickness t of the light-guiding layer corresponds to an opposite side, the expression of $\sin\theta=t/(t^2+X_c^2)^{0.5}$ is set up. When this correspondence relation is assigned to the relational expression 5, an expression of $nt^2/0.61\lambda$ (nm)$<(t^2+X_c^2)^{0.5}$ (nm) (a relational expression 3) is set up. By disposing the channel region in a manner to fulfill the relational expression 3, the end of the channel region can be disposed at a position exceeding a limitation of light-penetration. Thus, occurrence of the light leakage current can be minimized, which results from the stray light to the channel region. Since the occurrence of the light leakage current can be minimized, the noise generated due to the stray light can be minimized, thereby being able to provide the electro-optic substrate with high image quality.

In the electro-optic substrate according to this invention, the thin-film transistor contains an LDD region and the semiconductor layer with the distance $X_1$ between the end of the first light-shielding layer and the normal from the end of the channel region to the first light-shielding layer set to fulfill the relational expression 3, and with a distance $X_1$ (nm) between the end of the first light-shielding layer and a normal from an end of the LDD region to the first light-shielding layer set to fulfill an expression of $nt^2/0.61\lambda$ (nm)$<(t^2+X_c^2)^{0.5}$ (nm) (a relational expression 4).

With the above structure, the channel region and the LDD region are disposed at a position exceeding a penetration depth of the light. By disposing the channel region and the LDD region in a manner to fulfill expressions of $nt^2/0.61\lambda$ (nm)$<(t^2+X_c^2)^{0.5}$ (nm)(a relational expression 3) and $nt^2/0.61\lambda$ (nm)$<(t^2+X_1^2)^{0.5}$ (nm) (a relational expression 4), the penetration of the stray light into these regions can be minimized. Thus, the occurrence of the light leakage current at both of the channel region and the LDD region can be minimized. Since the occurrence of the light leakage current can be minimized at the LDD region as well, the generation of the noise due to the stray light can be minimized too, so that the electro-optic substrate with higher image quality can be provided.

A method of designing an electro-optic substrate according to this invention, the substrate includes a transparent substrate, a first light-shielding layer disposed on at least one part of a region surrounding an opening in a plane view, at a side of a first surface of the transparent substrate, a first insulating layer having a refraction index n and a layer-thickness t (nm), as an insulating layer sandwiched between the first light-shielding layer and the transparent substrate, and a thin-film transistor disposed between the first insulating layer and the transparent substrate, the thin-film transistor having a channel region positioned-inside the first light-shielding layer in a plane view. A distance $L_c$ (nm) between an end of the first light-shielding layer and an end of the channel region is designed to fulfill an expression of $nt^2/244$ (nm)$<L_c$ (nm) (a relational expression 1).

With the above designing method, because of the first shielding layer, such an electro-optic substrate can be designed that is improved in light-shielding performance with respect to the channel region of the thin-film transistor. Further, the light leakage current can be effectively reduced by designing the electro-optic substrate in a manner to fulfill the above relational expression with respect to a value of $L_c$ as a function of a layer-thickness of the first insulating layer.

A method of designing an electro-optic substrate according to this invention, the substrate includes a transparent substrate, a first light-shielding layer disposed on at least one part of a region surrounding an opening in a plane view, at a side of a first surface of the transparent substrate, a first insulating layer having a refraction index n and a layer-thickness t (nm), as an insulating layer sandwiched between the first light-shielding layer and the transparent substrate, and a thin-film transistor disposed between the first insulating layer and the transparent substrate, the thin-film transistor having a channel region positioned inside the first light-shielding-layer in a plane view. On the condition that $X_c$ (nm) is set to a distance between an end of the first light-shielding layer and a normal from an end of the channel region to the first light-shielding layer and X (nm) is set to a shortest wavelength of light that is possibly incident on the transparent substrate, an expression of $nt^2/0.61\lambda$ (nm)$<(t^2+X_c^2)^{0.5}$ (nm) (a relational expression 3) is fulfilled.

By the above designing method, because of the first shielding layer, such an electro-optic substrate can be designed that is improved in light-shielding performance with respect to the channel region of the thin-film transistor. Further, the light leakage current can be effectively reduced by designing the electro-optic. substrate in a manner to fulfill the above relational expression as a function of a layer-thickness of the first insulating layer.

A method of designing an electro-optic substrate according to this invention, the substrate includes a transparent substrate, a first light-shielding layer disposed on at least one part of a region surrounding an opening in a plane view, at a side of a first surface of the transparent substrate, a first insulating layer having a refraction index n and a layer-thickness t (nm), as an insulating layer sandwiched between the first light-shielding layer and the transparent substrate, and a thin-film transistor disposed between the first insulating layer and the transparent substrate, the thin-film transistor having a channel region positioned inside the first light-shielding layer in a plane view. A distance $L_1$ (nm) between an end of the first light-shielding layer and an end of the LDD region is designed to fulfill an expression of $nt^2/244$ (nm)$<L_1$ (nm) (a relational expression 2).

By the above designing method, because of the first shielding layer, such an electro-optic substrate can be designed that is improved in light-shielding performance with respect to the LDD region of the thin-film transistor as well. Further, the light leakage current can be effectively reduced by designing the electro-optic substrate in a manner to fulfill the above relational expression as a function of a layer-thickness of the first insulating layer.

A method of designing an electro-optic substrate according to this invention, the substrate includes a transparent substrate, a first light-shielding layer disposed on at least one part of a region surrounding an opening in a plane view, at a side of a first surface of the transparent substrate, a first insulating layer having a refraction index n and a layer-thickness t (nm), as an insulating layer sandwiched between the first light-shielding layer and the transparent substrate, and a thin-film transistor disposed between the first insulating layer and the transparent substrate, the thin-film transistor having a channel region positioned inside the first light-shielding layer in a plane view. On the condition that $X_1$ (nm) is set to a distance between an end of the first light-shielding layer and a normal from an end of the LDD region to the first light-shielding layer and $\lambda$ (nm) is set to a shortest wavelength of light that is possibly incident on the transparent substrate, an expression of $nt^2/0.61\lambda$ (nm)$<(t^2+X_1^2)^{0.5}$ (nm) (a relational expression 4) is fulfilled.

By the above designing method, because of the first shielding layer, such an electro-optic substrate can be designed that is improved in light-shielding performance with respect to the LDD region of the thin-film transistor as well. Further, the light leakage current can be effectively reduced by designing the electro-optic substrate in a manner to fulfill the above relational expression as a function of a layer-thickness of the first insulating layer.

According to this invention, an electro-optic device includes the electro-optic substrate described above.

With this structure, since the electro-optic device includes the electro-optic substrate in which the occurrence of the light leakage current is minimized, the electro-optic device achieving display with a high intensity can be provided.

According to this invention, an electronic device includes the electro-optic device described above.

With this structure, since the electronic device includes the electro-optic device achieving display with a high intensity, so that the electronic device having a display with excellent visibility can be provided.

EXPLANATION OF REFERENCE NUMERALS

1: a quartz substrate, 2: a silicon layer, 3: a gate electrode, 4: a second light-shielding layer, 5: a first insulating layer, 6: a gate wiring, 8: a drain electrode, 9: a light-signal wire, 10: a second interlayer insulating layer, 11: a drain wiring, 14: a deposited gate insulating layer, 15: a first interlayer insulating layer, 19: a pixel electrode, 21: a gate wire driving circuit, 22: a data wire driving circuit, 23: an input circuit, 24: a timing control circuit, 26: a pad region, 27: a display pixel region, 30: a liquid crystal panel, 31: a substrate, 32: a transparent substrate, 33: a counter electrode, 34: a TN-type liquid crystal, 35: a sealing member, 140: a thermally-oxidized gate insulating layer, 200: a channel region, 201: an LDD region, 205: a thin-film transistor, 208: a drain region, 209: a source region, 210: a silicon nitride layer, 211: a silicon oxide layer, 220: an electro-optic substrate, 230: a rear-type projector, 231: a light source, 232: an optical system, 234: a reflecting mirror, 235: a screen Best Mode for Carrying Out the Invention First Embodiment Hereinafter, a first embodiment will be described with reference to the drawings.

Figure 1:
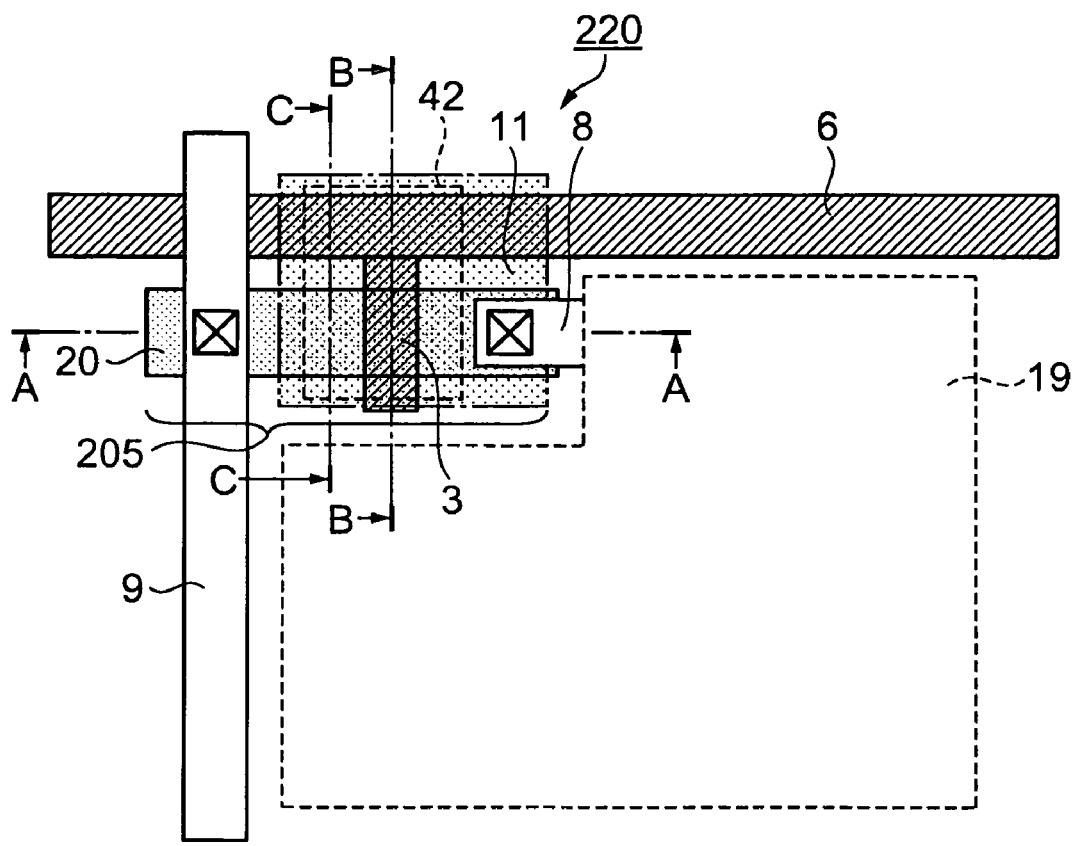
[FIG. 1] A plane view of an electro-optic substrate containing a thin-film transistor

FIG. 1 is a plane view of an electro-optic substrate including a thin-film transistor. A thin-film transistor 205 is driven with electric power transmitted through a signal wire 9 and a gate wiring 6. A drain electrode 8 is coupled to a pixel electrode 19 using ITO to control the potential of the pixel electrode 19.

Figure 2:
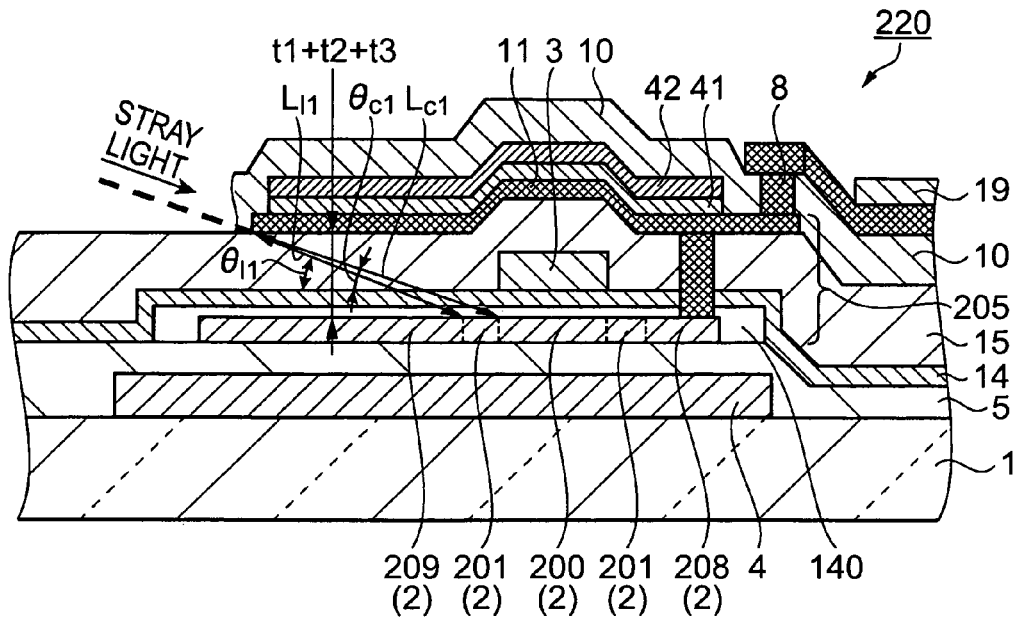
[FIG. 2] A cross-sectional view of the electro-optic substrate containing the thin-film transistor, corresponding to FIG. 1 along the line A-A

FIG. 2 is a cross-sectional view of FIG. 1 along the line A-A. Herein, a configuration which is not affected by stray light is omitted. A quartz substrate 1 as a transparent substrate is provided with a second light-shielding layer 4 using tungsten silicide. The second light-shielding layer 4 may have a thickness of about 100 to 1000 nm, for example. Herein, instead of the tungsten silicide, the second light-shielding layer 4 may employ as its material, a metal that can endure the highest temperature for the formation of an electro-optical substrate 220, the metal such as molybdenum, tungsten, or tantalum; polycrystal silicon; or molybdenum silicide. A first insulating layer 5 using silicon oxide, for example, is disposed in a manner to cover the second light-shielding layer 4. A silicon layer 2 is then disposed so as to be covered with the second light-shielding layer 4 in a plane view. The silicon layer 2 is assigned with a drain region 208, a source region 209, an LDD region 201, and a channel region 200. The silicon layer 2 may use polysilicon, single-crystal silicon (using the SOI technique), or amorphous silicon. This embodiment is preferably adopted for the single-crystal silicon since the single-crystal silicon receives a leakage current caused by penetration of the stray light which is larger t by about ten times compared with the polysilicon. By mitigating the effect by the stray light, a thin-film transistor can be used, that has a high transconductance (gm) resulting from a high mobility exhibited by the single-crystal silicon.

A thermally-oxidized gate insulating layer 140 obtained by thermally oxidizing the silicon layer 2, and a deposited gate insulating layer 14 using a layer formation method such as a CVD method are disposed in a manner to cover the silicon layer 2. The silicon oxide, for example, is preferable as a material of the deposited gate insulating layer 14. Instead of the silicon oxide, a material containing silicon nitride or hafnium oxide may be used. A gate electrode 3 is disposed in a position aligned in a self-aligning manner with a channel 200 so as to cover a part of the deposited gate insulating layer 14.

A first interlayer insulating layer 15 is disposed in a manner to cover the gate electrode 3 and the deposited insulating layer 14. A second interlayer insulating layer 10 is disposed in a manner to cover the first interlayer insulating layer 15. The drain electrode 8 is electrically coupled to a drain region 208. In this position, a drain wiring 11 is disposed, which has a function as a light-shielding layer (a first light-shielding layer) to block penetration of the light in the thin-film transistor 205.

In FIG. 2, the adverse effect of the light leakage current can be suppressed by minimizing the stray light obliquely penetrating an oblique direction from a region shielded by the drain wiring 11. To be more specific, by disposing the channel region 200 in a manner to cross over a breaking distance of an equivalent waveguide including the drain wiring 11, the silicon layer 2, and an insulator (a light-guiding layer) as a first insulating layer sandwiched between the drain wiring 11 and the silicon layer 2, the stray light can be prevented from penetrating the channel region 200. As shown in FIG. 2, the light-guiding layer of the equivalent waveguide is expressed in a three-layer structure including the thermally-oxidized gate insulating layer 140 (a thickness is set to t1 (nm)), the deposited gate insulating layer 14 (a thickness is set to t2 (nm)), and the first interlayer insulating layer 15 (a thickness is set to t3, (nm)) when viewed in a length direction of the channel region 200. Herein, to prevent penetration of the light, the following expression is set up on the condition that a wavelength of the light is set to $\lambda$ (nm), a total layer-thickness of the light-guiding layer with a multi-layer structure is set to t (nm), a refraction index of the light-guiding layer is set to n, and that an angle of incidence of the stray light is set to $\theta_{c1}$ based on the Rayleigh's diffraction condition. The expression is set to $t < (0.61 \times \lambda)/(n \times \sin \theta_{c1})$ (the relational expression 5a). In this case, the shortest wavelength of a visible light is set to 400 nm. In the case of expression of $\sin \theta_{c1}$ (opposite side/oblique side) using a distance $L_{c1}$ between the drain wiring 11 and the end of the channel region 200, $L_{c1}$ corresponds to the oblique side while the thickness of the light-guiding layer corresponds to t, $\sin \theta_{c1}$ is equal to $t/L_{c1}$. When this correspondence relation is assigned to the relational expression 5, the expression of $nt^2/244$ (nm) $< L_{c1}$ (nm) (the relational expression 1a) is set up. In a plane view, the drain wiring 11 is disposed so as to be trapped in the inside in a manner to fulfill this relational expression with respect to $L_{c1}$ (nm), so that the stray light can be prevented from penetrating the channel region 200. For example, with respect to the light-guiding layer of the equivalent waveguide, all of the three layers of the thermally-oxidized gate insulating layer 140, the deposited gate insulating layer 14, and the first interlayer insulating layer 15 are composed of the silicon oxide with a refraction index of 1.5, and the total layer-thickness of t (t1+t2+t3) is set under 285 nm in order to achieve $L_{c1}$ (nm) of 500 nm, for example. Herein, the transistor having the LDD region 201 is explained above as a structure of the thin-film transistor 205. However, the LDD region 201 is unnecessary and can be omitted in the case of employing a structure for blocking the incidence of the stray light into the channel region 200.

To prevent the stray light from penetrating the LDD region 201 in addition to the channel region 200, the above-described relational expression 1a is fulfilled while the above structure can be obtained in a manner similar to that described above. Herein, in expression using a distance $L_{11}$ (nm) between an end of the drain wiring 11 and an end of the LDD region 201 shown in FIG. 2, the expression of $nt^2/244$ (nm) $< L_{11}$ (nm) (the relational expression 2a) is set up. The stray light penetrating the LDD region 201 can be blocked by designing the LDD region 201 on the condition to fulfill the above relational expression.

Figure 3:
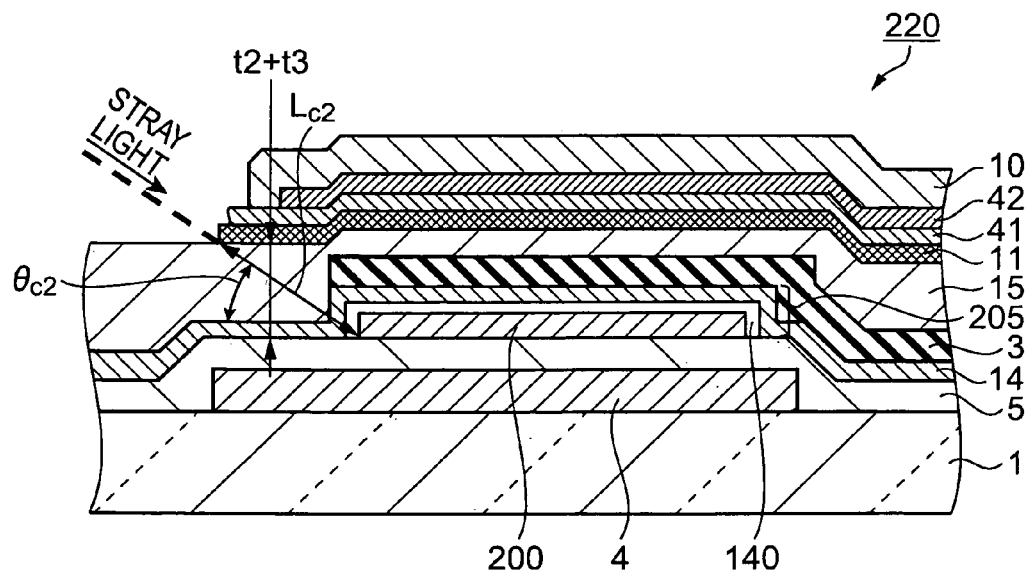
[FIG. 3] A cross-sectional view of the electro-optic substrate in FIG. 1 along the line B-B, showing a path through which stray light penetrates a channel region from a side surface of the channel region
Figure 4:
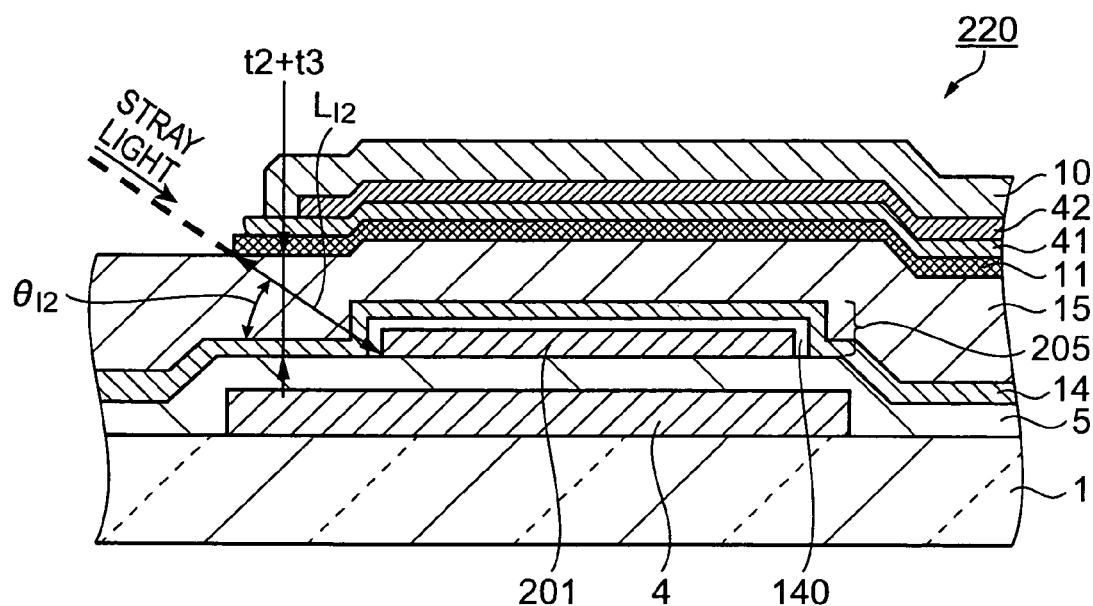
[FIG. 4] A cross-sectional view of the electro-optic substrate in FIG. 1 along the line C-C, showing a path through which the stray light penetrates an LDD region from a side surface of the LDD region

As a path through which the stray light penetrates, there is a path from a direction of the cross-sectional view of FIG. 1 along the line B-B (referred to as a side surface of the silicon layer 2), as shown in FIG. 3, in addition to the path from the source region 209 of the thin-film transistor 205 as shown in FIG. 2. In this case, the thermally-oxidized gate insulating layer 140 (t1 in FIG. 2) is not formed in the penetration path of the stray light, so that a penetration depth of the light is of different value from that shown in FIG. 2. The total thickness t of the light-guiding layer of the equivalent waveguide including the drain wiring 11, the silicon layer 2, and the region sandwiched between the drain wiring 11 and the silicon layer 2 is determined by the expression of t2+t3 (nm). In this case also, the penetration of the stray light from a side of the channel region 200 can be blocked by fulfilling the expression $nt^2/244$ (nm)$<L_{c2}$ (the relational expression 1b). With respect to the penetration of the light from the side surface into the LDD region 201, the total thickness t of the light-guiding layer is determined by the expression of t2+t3 (nm) in a similar manner as shown in FIG. 4 as a cross-sectional view of FIG. 1 along the line C-C. In this case also, the penetration of the stray light from the side surface into the LDD region 201 can be blocked by fulfilling the expression of $nt^2/244$ (nm) (the relational expression 2b). In design of the thin-film transistor according to this embodiment, values of t, $L_{c1}$, $L_{c2}$, $L_{11}$, and $L_{12}$ are set in a manner to fulfill the above relational expression. For example, an area per pixel is reduced with increase in the definition of the electro-optic substrate. In the value of $L_c$ or $X_c$, the design for maintaining the light-shielding performance can be conducted by reducing a layer-thickness of the first interlayer insulating layer 15 composing the light-guiding layer within a range that fulfills the above relational expression in the case of reduction.

Second Embodiment
Example of Laminated Structure of Films each having Different Refraction Index Hereinafter, a second embodiment will be described with reference to the drawings. In the first embodiment, the case is described, that the thermally-oxidized gate insulating layer 140, the deposited gate insulating layer 14, and the first interlayer insulating layer 15, which compose the light-guiding layer as the first insulating layer, each has the equal refraction index n. However, the structure that each of these layers has the different refraction index is also developable in a similar manner. For example, where the thermally-oxidized gate insulating layer 140 and the first interlayer insulating layer 15 are set to a silicon oxide film and the deposited gate insulating layer 14 is set to a silicon nitride film, respective refraction indexes are set to about 1.5 and about 2.1. In consideration of these values and each layer-thickness, the channel region and the LDD region can be disposed in a position exceeding the penetration depth of the stray light in a manner similar to the first embodiment.

Furthermore, it is possible for the first interlayer insulating layer to employ a multilayer structure of the silicon oxide layer and the silicon nitride layer. Use of the silicon nitride layer can prevent impurity penetration into the silicon layer. The silicon nitride layer functions as an etching stopping layer that is effective in the case of using a CMP method, so that a polishing process can be easily performed to a region including the pixel electrode region.

Figure 5:
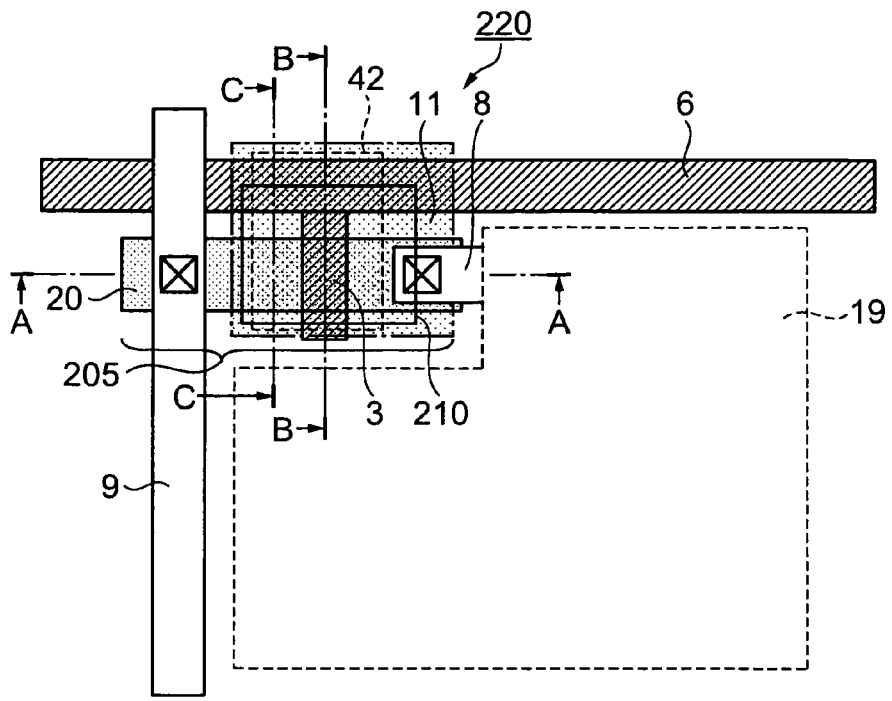
[FIG. 5] A plane view of the electro-optic substrate containing the thin-film transistor

FIG. 5 is a plane view of the electro-optic substrate including the thin-film transistor. The thin-film transistor 205 is driven through the signal wire 9 and the gate wiring 6. The drain electrode 8 is coupled to the pixel electrode 19 using the ITO, for example, to thereby control the potential of the pixel electrode. The silicon nitride 210 is disposed within an inner radius of the drain wiring 11 with a function as the light-shielding layer.

Figure 6:
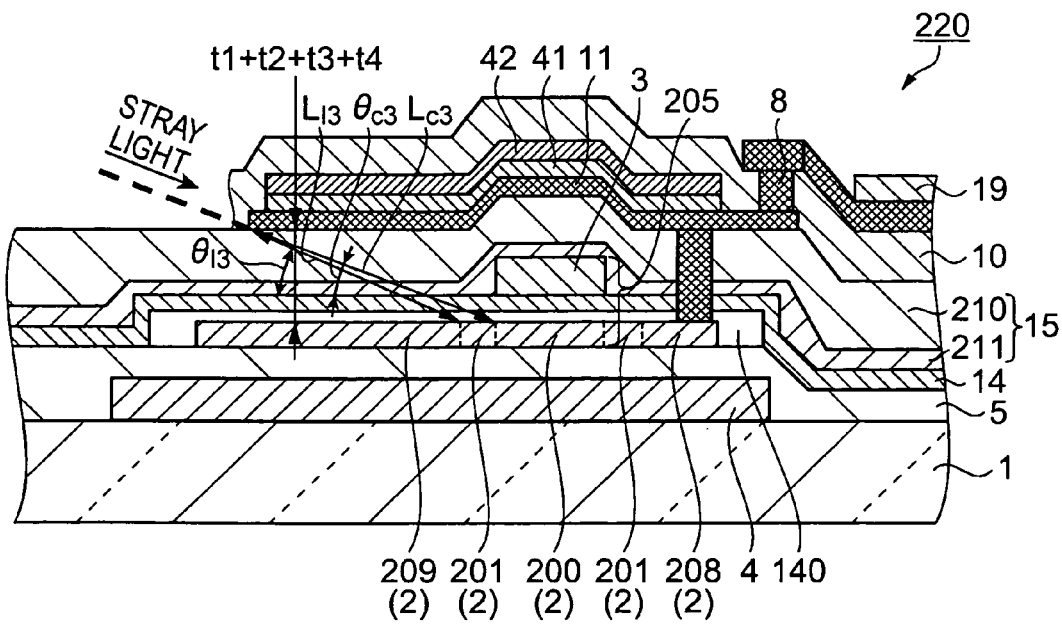
[FIG. 6] A cross-sectional view of the electro-optic substrate containing the thin-film transistor, corresponding to FIG. 5 along the line A-A

FIG. 6 is a cross-sectional view of FIG. 5 along the line A-A. Herein, a structure not affected by the stray light is omitted. The quartz substrate 1 as a transparent substrate is provided with the second light-shielding layer 4 using tungsten silicide. The second light-shielding layer 4 may have a thickness of about 100 to 1000 nm, for example. Herein, instead of the tungsten silicide, the second light-shielding layer 4 may use as its material, a metal that can endure the highest temperature for the formation of the electro-optic substrate 220, the metal such as molybdenum, tungsten, or tantalum; polycrystal silicon; or molybdenum silicide. The first insulating layer 5 using silicon oxide, for example, is disposed in a manner to cover the second light-shielding layer 4. The silicon layer 2 is then disposed so as to be surrounded by the second light-shielding layer 4 in a plane view. The silicon layer 2 is assigned with the drain region 208, the source region 209, the LDD region 201, and the channel region 200. The silicon layer 2 may use polysilicon, single-crystal silicon (using the SOI technique), or amorphous silicon. This embodiment is preferably adopted for the single-crystal silicon since the single-crystal silicon receives a leakage current caused by penetration of the stray light which is larger by about ten times compared with the polysilicon. By mitigating the effect by the stray light, a thin-film transistor can be used, that has a high transconductance (gm) resulting from a high mobility exhibited by the single-crystal silicon.

The thermally-oxidized gate insulating layer 140 obtained by thermally oxidizing the silicon layer 2, and the deposited gate insulating layer 14 using a layer formation method such as the CVD method are disposed in a manner to cover the silicon layer 2. The silicon oxide, for example, is preferable as a material of the deposited gate insulating layer 14. Instead of the silicon oxide, a material containing silicon nitride or hafnium oxide may be used. The gate electrode 3 is disposed in a position aligned with a channel 200 so as to cover a part of the deposited gate insulating layer 14.

The first interlayer insulating layer 15 is disposed in a manner to cover the gate electrode 3 and the deposited insulating layer 14. The first interlayer insulating layer 15 includes the silicon nitride layer 210 and a silicon oxide layer 211. Inclusion of the silicon nitride layer 210 produces an effect that a region including the pixel electrode can be easily polished in the case of using the CMP method, for example, since the silicon nitride layer 210 functions as an effective etching stopping layer. The effect of a stress arising from the silicon nitride layer 210 can be lessened by sandwiching the silicon oxide layer 211 between the silicon nitride layer 210 and the thin-film transistor 205.

The second interlayer insulating layer 10 is disposed in a manner to cover the first interlayer insulating layer 15. The drain electrode 8 is formed in a manner to be coupled to the drain region 208. In this position, the drain wiring 11 is disposed, which has a function as a light-shielding layer (the first light-shielding layer) to block penetration of the light from the thin-film transistor 205.

In FIG. 6, the adverse effect of the light leakage current can be suppressed by minimizing the stray light obliquely penetrating from a region shielded by the drain wiring 11. To be more specific, by disposing the channel region 200 in a manner to cross over a breaking distance of the equivalent waveguide including the drain wiring 11, the silicon layer 2, and the insulator (to be set to a light-guiding layer), the stray light can be prevented from penetrating the channel region 200. As shown in FIG. 6, the light-guiding layer of the equivalent waveguide is expressed in a four-layer structure including the thermally-oxidized gate insulating layer 140 (a thickness is set to t1 (nm)), the deposited gate insulating layer 14 (a thickness is set to t2 (nm)), the silicon oxide layer 211 (a thickness is set to t3 (nm)) forming the first interlayer insulating layer 15, and the silicon nitride layer 210 (a thickness is set to t4), when viewed in a length direction of the channel region 200.

In this case also, by setting $L_{c3}$ in consideration of refraction index and film-thickness of each layer composing the light-guiding layer, the channel region and the LDD region can be disposed in a position exceeding the penetration depth of the stray light in a manner similar to the first embodiment.

Herein, the transistor having the LDD region 201 is explained above as a structure of the thin-film transistor 205. However, the LDD region 201 is unnecessary and can be omitted in the case of employing a structure for blocking the incidence of the stray light into the channel region 200.

In the case of adopting the structure shown in FIG. 6, to prevent the stray light from penetrating the LDD region 201 in addition to the channel region 200, in a manner similar to that described above, the stray light can be prevented from penetrating the LDD 201 by setting a distance $L_{l3}$ (nm) between the end of the drain wiring 11 and the end of the LDD region 201 to a position exceeding the penetration depth of the stray light.

Figure 7:
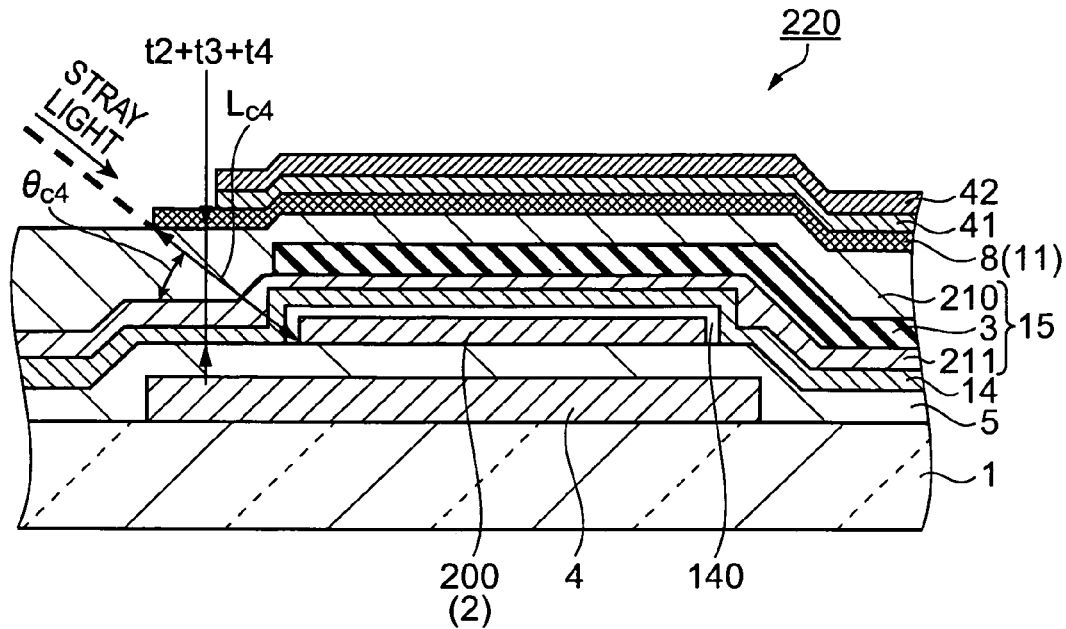
[FIG. 7] A cross-sectional view of the electro-optic substrate in FIG. 5 along the line B-B, showing a path through which the stray light penetrates the channel region from the side surface of the channel region
Figure 8:
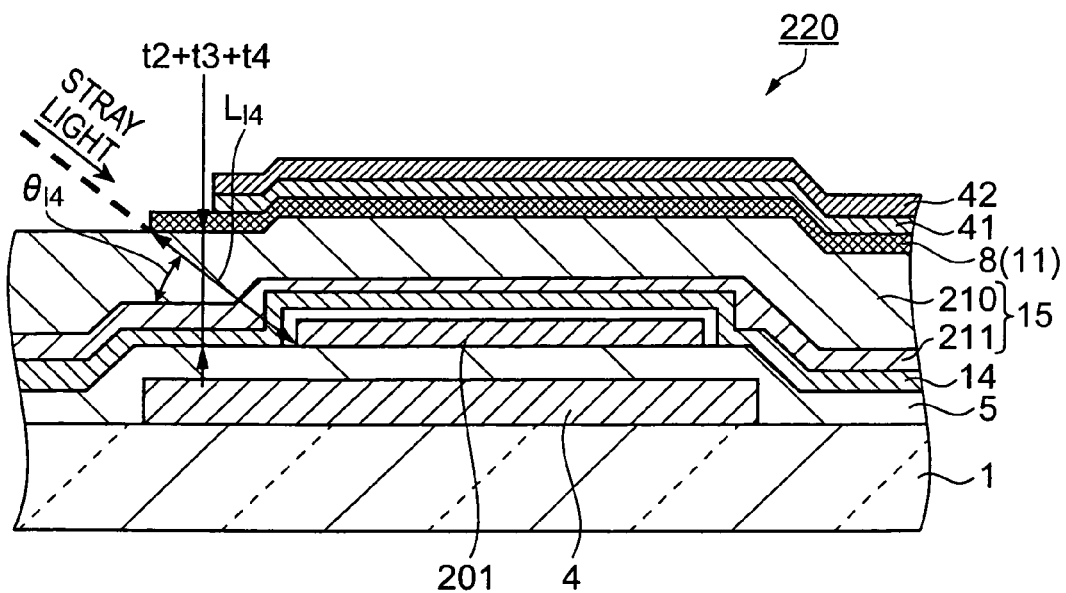
[FIG. 8] A cross-sectional view of the electro-optic substrate in FIG. 5 along the line C-C, showing a path through which the stray light penetrates the LDD region from the side surface of the LDD region

As a path through which the stray light penetrates, there is a path in a direction of the cross-sectional view of FIG. 5 along the line B-B (referred to as a side surface of the silicon layer 2), in addition to the path from the source region 209 of the thin-film transistor 205. FIG. 7 is a cross-sectional view of a plain view shown in FIG. 5 along the line B-B. In a direction shown in FIG. 7 (referred to as a side surface of the silicon layer 2), the thermally-oxidized gate insulating layer 140 is not formed in the incidence path of the stray light, so that the penetration depth of the light is of different value from that shown in the drawing. The total thickness t of the light-guiding layer of the equivalent waveguide including the drain wiring 11, the silicon layer 2, and the insulator (set to the light-guiding layer) sandwiched between the drain wiring 11 and the silicon layer 2 is determined by the expression of t2+t3+t4 (nm). In this case also, the penetration of the stray light from a side of the channel region 200 can be blocked by setting a distance $L_{c4}$ (nm) between the drain wiring 11 and the end of the channel region 200 to a position exceeding the penetration depth of the stray light. With respect to the penetration from the side to the LDD region, in a similar manner, as shown in FIG. 8 as a cross-sectional view of FIG. 5 along the line C-C corresponding to the LDD region, the stray light can be prevented from penetrating from the side surface of the LDD region 201 by setting a distance $L_{l4}$ (nm) between the drain wiring 11 and the end of the LDD region 201 to a position exceeding the penetration depth of the stray light. In design of the thin-film transistor according to this embodiment, values of t, $L_{c3}$, $L_{c4}$, $L_{l3}$, and $L_{l4}$ are set in a manner to fulfill the above relation. For example, an area per pixel is reduced with increase in the definition of the electro-optic substrate. The design for maintaining the light-shielding performance can be conducted by reducing a layer-thickness of the first interlayer insulating layer 15 composing the light-guiding layer within a range that fulfills the above relational expression in the case of reduction in the value of $L_c$ or $X_c$.

Third Embodiment

In this embodiment, with respect to the refraction index n and the film thickness t (=(t2+t3)nm) of the film composing the light-guiding layer, setting is described for a distance Xc (nm) between the end of the first light-shielding layer and a normal from the end of the channel region to the first light-shielding layer, and the shortest wavelength λ (nm) of the light that is possibly incident on the transparent substrate (the electro-optic substrate).

Figure 12:
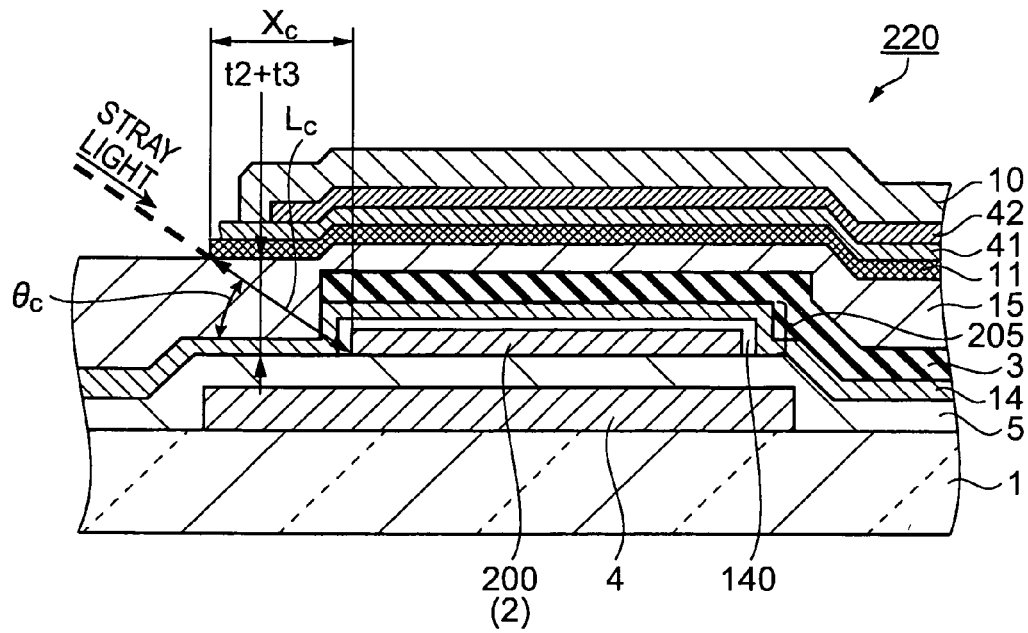
[FIG. 12] A cross-sectional view of the electro-optic substrate in FIG. 1 along the line B-B, showing a path through which the stray light penetrates the channel region from the side surface of the channel region

FIG. 12 is a view showing a state where the stray light penetrates into the channel region 200 of the thin-film transistor 205 at a penetration angle $\theta_c$. To prevent the stray light from reaching the channel region 200, it is only necessary to set a layer-thickness t in a manner to fulfill the below expression based on the Rayleigh's diffraction condition.

$$t<(0.61\times\lambda)/(n\times\sin\theta_c) \qquad \text{(the relational expression 5a)}$$

In the relational expression 5a, sin $\theta_c$ is set to opposite side/oblique side, and this relation can be expressed by the expression (layer-thickness t (nm)/distance $(X_c^2+t^2)^{0.5}$ (nm)). The following relational expression can be set up by assigning and organizing the above to the relational expression 5a.

$$Nt^2/0.61\lambda \text{ (nm)}<(t^2+Xc^2)^{0.5} \text{ (nm)} \qquad \text{(the relational expression 3)}$$

Furthermore, it is also necessary to set up the aforementioned relational expression 1 ($nt^2/244$ (nm)<$L_c$ (nm)).

With respect to the shortest wavelength λ (nm) of the light that is possibly incident and the refraction index n of the layer composing the light-guiding layer, as described above, the total layer-thickness of the layers composing the light-guiding layer and the distance $X_c$ between the end of the first light-shielding layer and a normal from the end of the channel region to the first light-shielding layer are controlled to thereby prevent the stray light from penetrating the channel region 200. Also, the noise due to the stray light is reduced to thereby provide the electro-optic substrate with a high image quality.

In design of the thin-film transistor according to this embodiment, values of t, $L_c$, and $X_c$ are set in a manner to fulfill the above relational expressions 1 and 3. For example, an area per pixel is reduced with increase in the definition of the electro-optic substrate, the design for maintaining the light-shielding performance can be conducted by reducing a layer-thickness of the first interlayer insulating layer 15 composing the light-guiding layer within a range that fulfills the above relational expression 1 or 3, in the case of reduction in the value of $L_c$ or $X_c$.

Fourth Embodiment

In this embodiment, with respect to the refraction index n and the film thickness t (nm) of the film composing the light-guiding layer, setting is described for a distance X1 (nm) between the end of the first light-shielding layer and a normal from the end of the LDD region to the first light-shielding layer, and the shortest wavelength λ (nm) of the light that is possibly incident on the transparent substrate (the electro-optic substrate).

Figure 13:
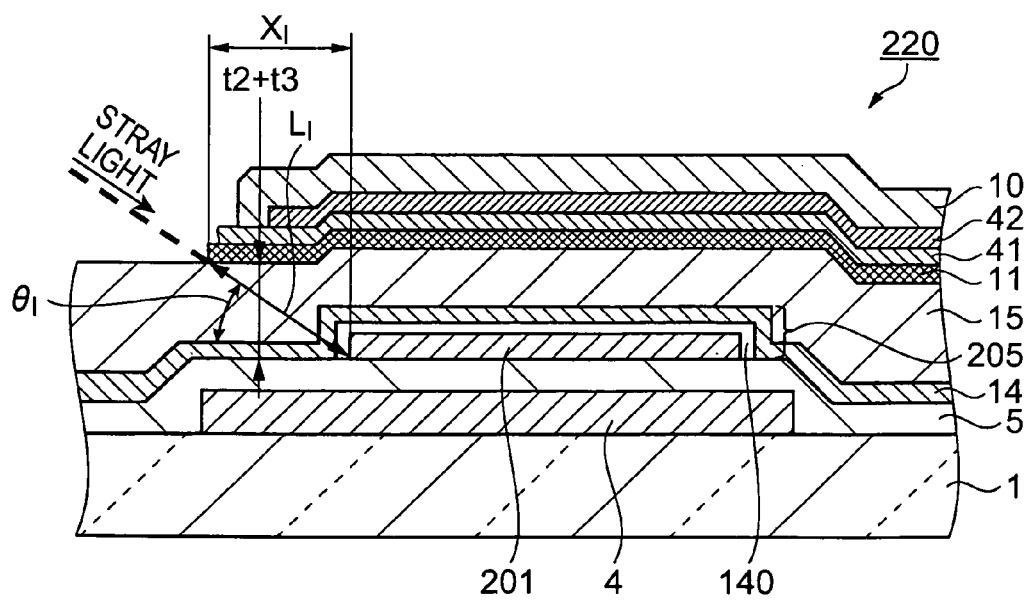
[FIG. 13] A cross-sectional view of the electro-optic substrate in FIG. 1 along the line C-C, showing a path through which the stray light penetrates the LDD region from the side surface of the LDD region

FIG. 13 is a view showing a state where the stray light penetrates the LDD region 201 of the thin-film transistor 205 at a penetration angle $\theta_1$. To prevent the stray light from reaching the LDD region 201, it is only necessary to set a layer-thickness t in a manner to fulfill the below expression derived from the Rayleigh's diffraction condition.

$$t<(0.61\times\lambda)/(n\times\sin\theta_1) \qquad \text{(the relational expression 5a)}$$

In the relational expression 5a, sin $\theta_c$ is set to opposite side/oblique side, and this relation can be expressed by the expression (layer-thickness t (nm)/distance $(X_1^2+t^2)^{0.5}$ (nm)). The following relational expression can be set up by assigning and organizing the above to the relational expression 5a.

$$nt^2/0.61\lambda \text{ (nm)}<(t^2+X_1^2)^{0.5} \text{ (nm)} \qquad \text{(the relational expression 4)}$$

Furthermore, it is also necessary to set up the aforementioned relational expression 2 ($nt^2/244$ (nm)$<L_1$ (nm)).

With respect to the shortest wavelength λ (nm) of the light that is possibly incident and the refraction index n of the layer composing the light-guiding layer, as described above, the total layer-thickness of the layers composing the light-guiding layer and the distance $X_1$ between the end of the first light-shielding layer and a normal from the end of the LDD region to the first light-shielding layer are controlled to thereby prevent the stray light from penetrating the LDD region 201. Also, the noise due to the stray light is reduced to thereby provide the electro-optic substrate with a high image quality.

In design of the thin-film transistor according to this embodiment, values of t, $L_1$, and $X_1$ are set in a manner to fulfill the above relational expressions 2 and 4. For example, an area per pixel is reduced with increase in the definition of the electro-optic substrate, the design for maintaining the light-shielding performance can be conducted by reducing a layer-thickness of the first interlayer insulating layer 15 composing the light-guiding layer in a range that fulfills the above relational expressions in the case of reduction in the value of $L_1$ or $X_1$.

Fifth Embodiment

Figure 9:
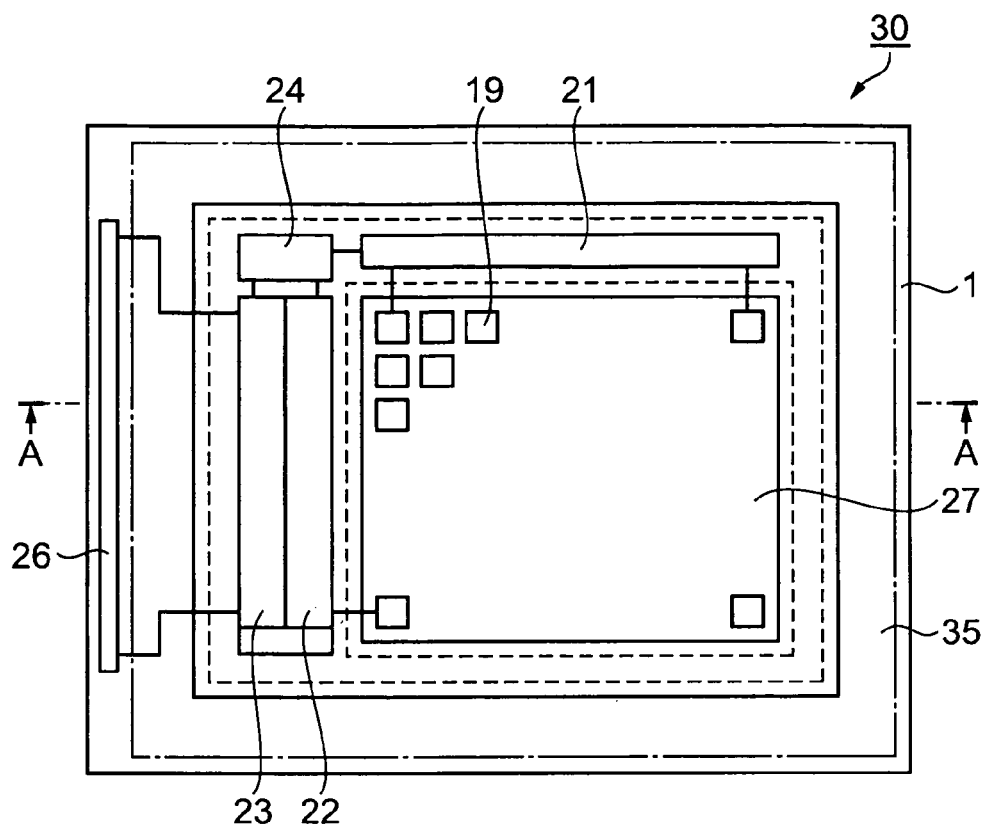
[FIG. 9] A plane view of a liquid crystal panel as an electro-optic device

Hereinafter, a liquid crystal panel as an electro-optic device containing the above-described electro-optic substrate will be described as a fifth embodiment. FIG. 9 is a plane view of a liquid crystal panel. As shown in FIG. 9, in a liquid crystal panel 9, a display pixel region 27 is formed on the quartz substrate 1, and the electro-optic substrate 220 (see, FIG. 6) provided with the pixel electrode 19 in a matrix pattern is contained. A gate wire driving circuit 21 sequentially scans a gate signal wiring (not shown) while data wire driving circuit 22 provides an image signal according to image data to a source signal wiring (not shown). Furthermore, circuits are provided, such as an input circuit 23 that captures the image data input from an outside through a pad region 26 and a timing control circuit 24 for controlling these circuits.

Figure 10:
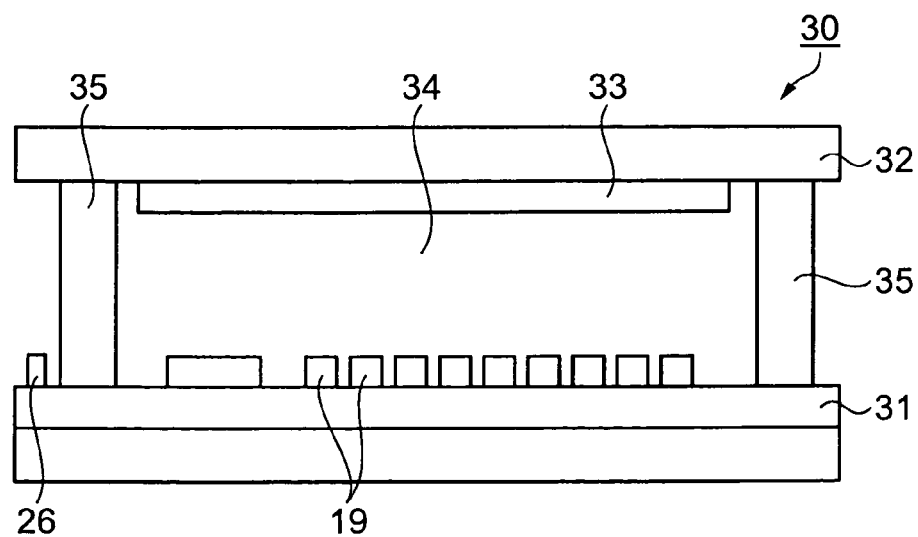
[FIG. 10] A cross-sectional view of the liquid crystal panel in FIG. 9 along the line A-A

FIG. 10 is a cross-sectional view of the liquid crystal panel along the line A-A described with reference to FIG. 9. In the liquid crystal panel, a substrate 31 provided with a display pixel and a driving circuit, and a transparent substrate 32 as a transparent conducting film, having a counter electrode 33 containing ITO are disposed with a certain interval therebetween. In a gap peripherally sealed with a sealing member 35, a TN (Twisted-Nematic) type liquid crystal 34, an SH (Supper-Homeotropi) type liquid crystal in which liquid crystal molecules are oriented in substantially a vertical direction without application of the voltage, and the like are filled. The liquid crystal panel 30 as the electro-optic device employs the above-described structure. It is to be noted that a position to be provided with the sealing member 35 is set so that the pad region 26 is disposed outside the sealing member 35 in order to input the signal from the outside. The liquid crystal panel 30 employs the aforementioned thin-film transistor 205 that prevents penetration of the stray light in an oblique direction. Therefore, the liquid crystal panel 30 can be provided as the electro-optic device suitable for application in the case of using a high-intensity light source (the stray light with the high intensity).

Sixth Embodiment

Figure 11:
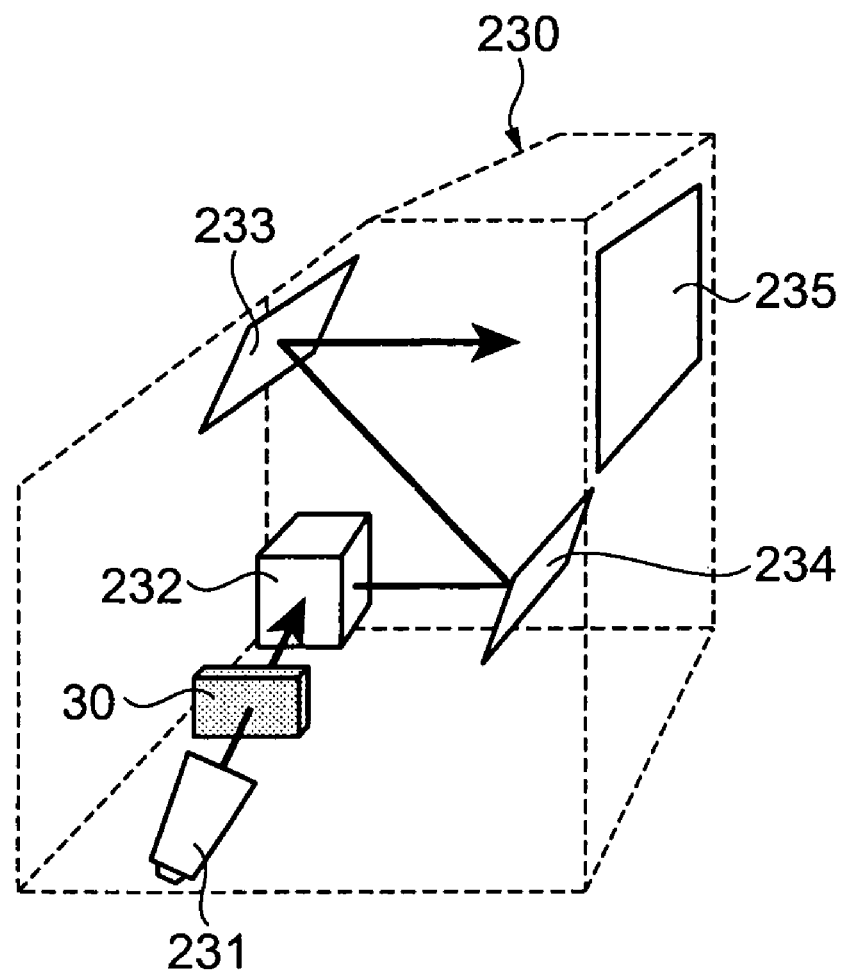
[FIG. 11] A frame format of a rear-type projector as an electronic device

Hereinafter, as a sixth embodiment, an electronic device using the above-described liquid crystal panel as the electro-optic device will be described. FIG. 11 is a frame format of a rear-type projector on which the above-described liquid crystal panel as the electronic device is mounted. A rear-type projector 230 uses as a light valve the aforementioned liquid crystal panel 30. The liquid crystal panel 30 provides the image information to light emitted from a light source 231. An optical system 232 controls the light flux. The reflecting mirrors 233, 234 display the image on the screen 235. The intensity of light which is incident on the liquid crystal panel 30 used in the rear-type projector 230 is extremely high while the high image quality is required. The light intensity is extremely high, causing the stray light with the high intensity. The liquid crystal panel 30 with the above-described structure is configured to control the adverse effect by this stray light. Therefore, the rear-type projector 230 as the electronic device containing the liquid crystal panel 30 can minimize the adverse effect by the stray light, thereby achieving the output image with a high image quality. As application fields other than the rear-type projector 230, this embodiment can be applied for electronic devices such as a front-type projector, a cellular phone, a video camera, a facsimile machine with a display function, a finder of a digital camera, a portable TV, a DSP device, a PDA, an electronic notebook, an electronic billboard, a display for advertising, an IC card, and the like.

[Modifications]

In the first to fourth embodiments, the examples using the thin-film transistor of a top gate type have been described but a thin-film transistor of a bottom gate type may be used.

Industrial Applicability

In order to prevent the stray light from reaching the channel portion through the equivalent optical waveguide composed of the light-shielding layer and the insulating layer, it is preferable that the equivalent optical waveguide fulfill the light-blocking condition for preventing the light penetration. Where the penetration first insulating layer is set to have the layer-thickness t (nm) and the refraction index n, the below expression is set up. $t<(0.6\times\lambda)/(n\times\sin\theta)$ On the condition that the value of λ is se to a lower limit 400 (nm) of the visible light wavelength while the distance between the end of the light-shielding layer and the end of the channel region is set to $L_c$ (nm), and these values are assigned into the expression, the expression of $nt^2/244$ (nm)$<L_c$ (nm) is set up. The film-thickness of the first insulating layer and the distance between the end of the light-shielding layer and the end of the channel region are controlled in a manner to fulfill the above expression, thereby being able to minimize deterioration in the image quality due to the penetration of the stray light in the oblique direction.

The invention claimed is:

1. An electro-optic substrate, comprising:
 a transparent substrate;
 a first light-shielding layer disposed on at least one part of a region surrounding an opening in a plane view, at a side of a first surface of the transparent substrate;
 a first insulating layer having a refraction index n and a layer-thickness t (nm), as an insulating layer sandwiched between the first light-shielding layer and the transparent substrate;
 a thin-film transistor disposed between the first insulating layer and the transparent substrate, the thin-film transistor having a channel region positioned inside the first light-shielding layer in a plane view,
 a semiconductor layer with a distance $L_c$ (nm) between an end of the first light-shielding layer and an end of the channel region set to fulfill a relational expression 1 that states: $nt^2/244$ (nm)$<L_c$ (nm);
 a gate insulating layer covering at least the channel region;
 a gate electrode disposed to a region opposite to the channel region with the gate insulating layer intervened therebetween;

a second light-shielding layer disposed between the semiconductor layer and the transparent substrate; and a second insulating layer disposed between the semiconductor layer and the second light-shielding layer.

2. The electro-optic substrate according to claim 1, wherein the thin-film transistor contains an LDD region and the semiconductor layer with the distance $L_c$ between the end of the first light-shielding layer and the end of the channel region set to fulfill the relational expression 1, and with a distance $L_1$ (nm) between the end of the first light-shielding layer and an end of the LDD region set to fulfill a relational expression 2 that states: $nt^2/244(nm) < L_1$ (nm).

3. An electro-optic substrate, comprising:

a transparent substrate;

a first light-shielding layer disposed on at least one part of a region surrounding an opening in a plane view, at a side of a first surface of the transparent substrate;

a first insulating layer having a refraction index n and a layer-thickness t (nm), as an insulating layer sandwiched between the first light-shielding layer and the transparent substrate;

a thin-film transistor disposed between the first insulating layer and the transparent substrate, the thin-film transistor having a channel region positioned inside the first light-shielding layer in a plane view;

a semiconductor layer set to fulfill, on the condition that $X_c$ (nm) is set to a distance between an end of the first light-shielding layer and a normal from an end of the channel region to the first light-shielding layer and $\lambda$ (nm) is set to a shortest wavelength of light that is possibly incident on the transparent substrate, a relational expression 3 that states: $nt^2/0.61\lambda(nm) < (t^2+X_c^2)0.5$ (nm);

a gate insulating layer covering at least the channel region;

a gate electrode disposed to a region opposite to the channel region with the gate insulating layer intervened therebetween;

a second light-shielding layer disposed between the semiconductor layer and the transparent substrate; and a second insulating layer disposed between the semiconductor layer and the second light-shielding layer.

4. The electro-optic substrate according to claim 3, wherein the thin-film transistor contains an LDD region and the semiconductor layer with the distance $X_1$ (nm) between the end of the first light-shielding layer and the normal from the end of the channel region to the first light-shielding layer set to fulfill the relational expression 3, and with a distance $X_1$ (nm) between the end of the first light-shielding layer and a normal from an end of the LDD region to the first light-shielding layer set to fulfill a relational expression 4 that states: $nt^2/0.61\lambda(nm) < (t^2+X_1^2)0.5$ (nm).

5. A method of making an electro-optic substrate comprising the steps of: (A) providing a transparent substrate, (B) providing a first light-shielding layer disposed on at least one part of a region surrounding an opening in a plane view, at a side of a first surface of the transparent substrate, (C) providing a first insulating layer having a refraction index n and a layer-thickness t (nm), as an insulating layer sandwiched between the first light-shielding layer and the transparent substrate, and (D) disposing a thin-film transistor between the first insulating layer and the transparent substrate, the thin-film transistor having a channel region positioned inside the first light-shielding layer in a plane view, and in the method steps (A)-(D) forming the electro-optic substrate such that a distance $L_c$ (nm) between an end of the first light-shielding layer and an end of the channel region fulfills a relational expression 1 that states: $nt^2/244$ (nm) $< L_c$ (nm).

6. A method of making an electro-optic substrate comprising the steps of: (A) providing a transparent substrate, (B) providing a first light-shielding layer disposed on at least one part of a region surrounding an opening in a plane view, at a side of a first surface of the transparent substrate, (C) providing a first insulating layer having a refraction index n and a layer-thickness t (nm), as an insulating layer sandwiched between the first light-shielding layer and the transparent substrate, and (D) disposing a thin-film transistor between the first insulating layer and the transparent substrate, the thin-film transistor having a channel region positioned inside the first light-shielding layer in a plane view, and in the method steps (A)-(D) forming the electro-optic substrate so as to fulfill a relational expression 3 that states: $nt^2/0.61\lambda(nm) < (t^2+X_c^2)0.5$ (nm), on the condition that Xc (nm) is set to a distance between an end of the first light-shielding layer and a normal from an end of the channel region to the first light-shielding layer and $\lambda$ (nm) is set to a shortest wavelength of light that is possibly incident on the transparent substrate.

7. A method of making an electro-optic substrate comprising the steps of: (A) providing a transparent substrate, (B) providing a first light-shielding layer disposed on at least one part of a region surrounding an opening in a plane view, at a side of a first surface of the transparent substrate, (C) providing a first insulating layer having a refraction index n and a layer-thickness t (nm), as an insulating layer sandwiched between the first light-shielding layer and the transparent substrate, and (D) disposing a thin-film transistor between the first insulating layer and the transparent substrate, the thin-film transistor having a channel region positioned inside the first light-shielding layer in a plane view, and in the method steps (A)-(D) forming the electro-optic substrate such that a distance L1 (nm) between an end of the first light-shielding layer and an end of the LDD region fulfills a relational expression 2 that states:

$nt^2/244$ (nm) $< L_1$ (nm).

8. A method of making an electro-optic substrate comprising the steps of: (A) providing a transparent substrate, (B) providing a first light-shielding layer disposed on at least one part of a region surrounding an opening in a plane view, at a side of a first surface of the transparent substrate, (C) providing a first insulating layer having a refraction index n and a layer-thickness t (nm), as an insulating layer sandwiched between the first light-shielding layer and the transparent substrate, and (D) disposing a thin-film transistor between the first insulating layer and the transparent substrate, the thin-film transistor having a channel region positioned inside the first light-shielding layer in a plane view, and in the method steps (A)-(D) forming the electro-optic substrate so as to fulfill a relational expression 4 that states: $nt^2/0.61\lambda(nm) < (t^2+X_1^2)0.5$ (nm), on the condition that X1 (nm) is set to a distance between an end of the first light-shielding layer and a normal from an end of the LDD region to the first light-shielding layer and $\lambda$ (nm) is set to a shortest wavelength of light that is possibly incident on the transparent substrate.

9. An electro-optic device comprising the electro-optic substrate according claim 1.

10. An electronic device comprising the electro-optic device according to claim 9.

11. An electro-optic device comprising the electro-optic substrate according claim 2.

12. An electro-optic device comprising the electro-optic substrate according claim 3.

13. An electro-optic device comprising the electro-optic substrate according claim 4.

* * * * *